United States Patent [19]

Clariou

[11] Patent Number: 4,937,935

[45] Date of Patent: Jul. 3, 1990

[54] PROCESS FOR MAKING AN ASSEMBLY OF ELECTRICALLY CONDUCTIVE PATTERNS ON AN INSULATING SURFACE OF COMPLEX FORM

[75] Inventor: Jean-Pierre Clariou, Maisons Laffitte, France

[73] Assignee: Societe Nationale Industrielle et Aerospatiale, Paris, France

[21] Appl. No.: 350,740

[22] PCT Filed: Aug. 11, 1988

[86] PCT No.: PCT/FR88/00413

§ 371 Date: Mar. 16, 1989

§ 102(e) Date: Mar. 16, 1989

[87] PCT Pub. No.: WO89/02213

PCT Pub. Date: Mar. 9, 1989

[30] Foreign Application Priority Data

Aug. 24, 1987 [FR] France .................. 87 11851

[51] Int. Cl.$^5$ ............................ H05K 3/02
[52] U.S. Cl. ................... 29/846; 174/250; 174/257; 204/15; 427/96; 428/901
[58] Field of Search ............... 29/846; 428/901; 427/96; 174/68.5, 250, 257; 204/15

[56] References Cited

U.S. PATENT DOCUMENTS

| | | | |
|---|---|---|---|
| 2,724,674 | 11/1955 | Pritikin | 428/901 X |
| 2,874,085 | 2/1959 | Brietzke | 29/846 X |
| 2,910,351 | 10/1959 | Szpak et al. | 41/43 |
| 3,024,151 | 3/1962 | Robinson | 29/846 X |
| 3,230,163 | 1/1966 | Dreyfus | 428/901 X |
| 3,279,969 | 10/1966 | Borchardt | 29/846 X |
| 3,757,087 | 9/1973 | Bernard | 174/68.5 X |
| 3,832,176 | 8/1974 | Verstraete et al. | 96/67 |
| 3,950,200 | 4/1976 | Muramoto et al. | 428/901 X |
| 4,106,187 | 8/1978 | Smith et al. | |
| 4,499,152 | 2/1985 | Green et al. | 427/96 X |
| 4,697,335 | 10/1987 | Pedersen et al. | 29/846 X |

FOREIGN PATENT DOCUMENTS

| | | |
|---|---|---|
| 2514176 | 6/1977 | Fed. Rep. of Germany . |
| 1158793 | 6/1958 | France . |
| 53-114074 | 10/1978 | Japan ............ 427/96 |

OTHER PUBLICATIONS

IBM Tech. Discl. Bull., vol. 2, No. 1, Jun. 1959, p. 9, by M. M. Haddad et al.

Primary Examiner—Carl E. Hall
Assistant Examiner—C. J. Arbes
Attorney, Agent, or Firm—Fisher, Christen & Sabol

[57] ABSTRACT

The present invention relates to a process for making an assembly of electrically conductive patterns (9, 16) on an electrically insulating surface (20) of complex shape.

According to the invention:

said assembly of patterns (16) is formed on a face of a plastically deformable flat support (10);

said flat support (10) is applied, by being deformed, against said surface (20) of complex shape; and said deformed flat support is connected to said surface (20) of complex shape.

The invention finds an advantageous application in the production of reflectors for antennas.

14 Claims, 3 Drawing Sheets

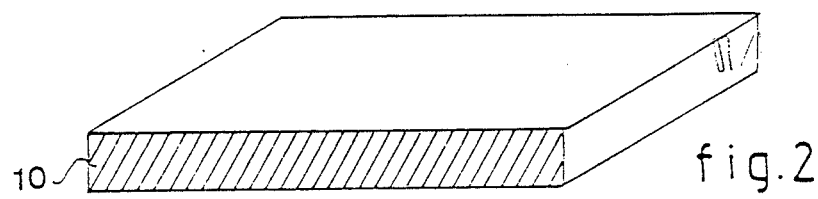
fig.2
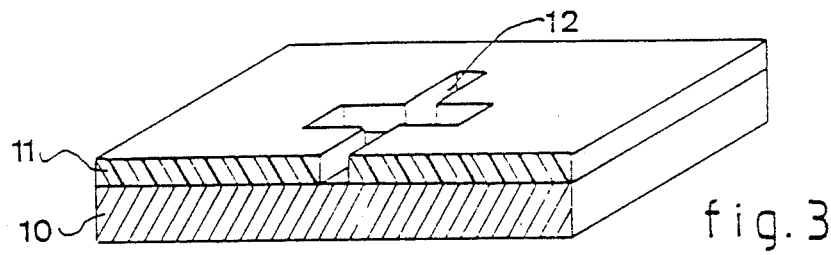
fig.3
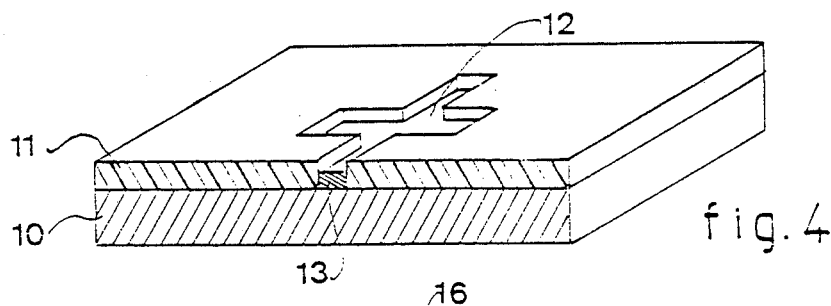
fig.4
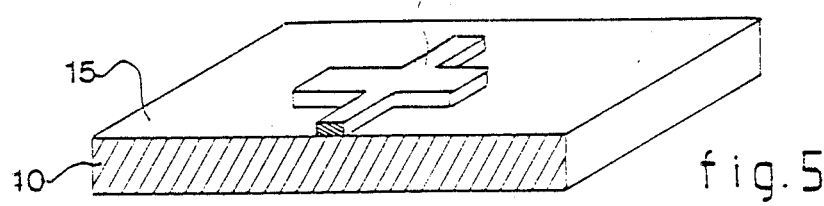
fig.5
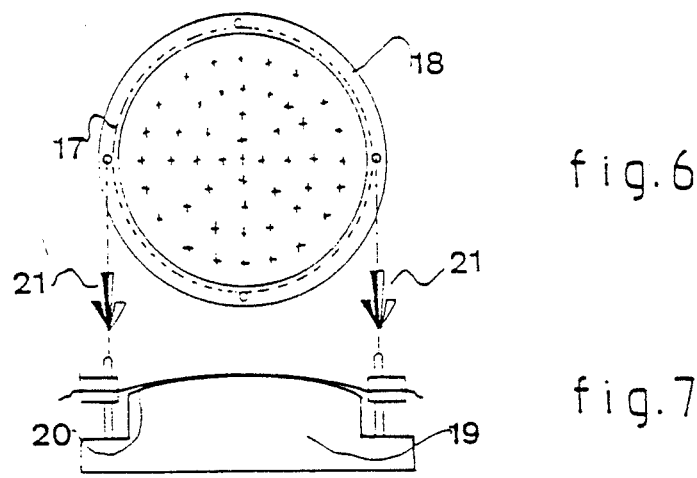
fig.6
fig.7

PROCESS FOR MAKING AN ASSEMBLY OF ELECTRICALLY CONDUCTIVE PATTERNS ON AN INSULATING SURFACE OF COMPLEX FORM

The present invention relates to processes for making an assembly of conductive patterns on an insulating surface of complex form and, in particular, for making printed circuits presenting a complex surface which, a priori, is not developable, for example those which are used for making reflectors of antennas with discrete resonant elements distributed over surfaces of conical, parabolic, hyperbolic, etc . . . type, or those which enter in the structure of complex antennas comprising primary reflectors and secondary reflectors, as in the assemblies known to technicians under the names of Newton, Cassegrain, etc. assemblies.

Several processes to that end already exist. One of them consists in making conductive patterns on a supple, flat support, for example an elastomer. This supple support is then drawn then glued on a form identical to that which is to be obtained. Another process consists in making the conductive patterns on a rigid support, for example a strip of a film of material known under the name KAPTON. This support is then cut out into strips or sectors of reduced width, thus more easily deformable. These strips are then glued on a substrate having the definitive form chosen. Finally, the process is known which consists in machining a metallized surface coated with a protecting varnish and superficially engraved mechanically along the contour of the desired patterns. Those parts which are not operative are then eliminated, like a skin, this operation generally being carried out manually.

It is obvious that these processes present drawbacks, for example, for the first process, a poor resistance of the conductive patterns, particularly in the event of considerable variations in temperature. The other two processes seem more reliable, but the complexity of their embodiment does not render them industrializable and they can only be used punctually.

The present invention has for its object a process for making printed circuits presenting a complex surface which is non-developable or developable only with great difficulty, which overcomes the drawbacks of the known processes, whilst conserving certain of their qualities.

More precisely, the present invention has for its object a process for making an assembly of electrically conductive patterns on an electrically insulating surface of complex form, noteworthy in that:
said assembly of patterns is formed on a face of a plastically deformable flat support;
said flat support is applied, by being deformed, against said surface of complex form; and
said deformed flat support is connected with said surface of complex form.

The Figures of the accompanying drawing will clearly show how the invention may be carried out. In these Figures, identical references designate like elements.

FIGS. 2 to 7 show diagrams illustrating the different successive steps of carrying out the process according to the invention.

Figure 1:
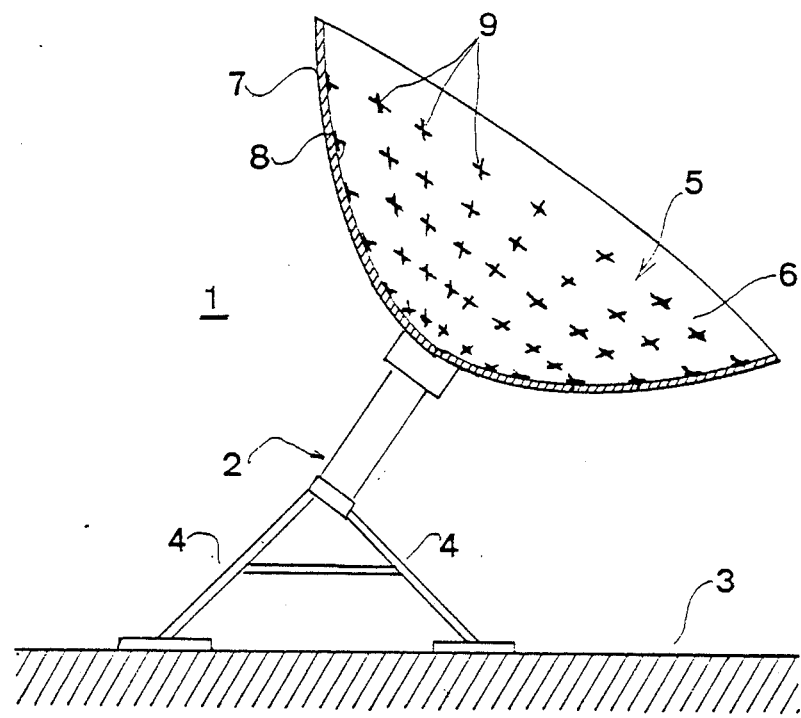
FIG. 1 shows an antenna reflector in which the product obtained by the process according to the invention finds a particularly advantageous application.

The present invention concerns a process for making printed circuits presenting complex surfaces which are non-developpable or at least fairly difficult to develop. These circuits are of very great importance in modern techniques and are in particular currently used in reflectors of antennas 1 such as the one illustrated in FIG. 1. This reflector 1 is mounted on a support 2, which cooperates with a support surface 3 via arms 4. The reflector 1 presents a surface which is non-developpable in shape, for example paraboloid 5. The surface 6 of this paraboloid is constituted by a support 7 made of an electrically insulating material comprising on its surface 8 patterns 9 which, themselves, are electrically conductive. By way of example, patterns in the form of crosses have been shown, but it is obvious that these patterns may be in any other shapes necessary for the technicians.

In order to make such electrically conductive patterns, the process as described hereinafter is advantageously used, which, with respect to the processes of the prior art, gives very good results, but which presents the additional advantage of being able to be industrialized for large-scale production.

The different principal phases of the process are shown in FIGS. 2 to 7.

The process consists, in a first stage, in making a first flat support 10 whose dimensions are close to those which must be obtained for making the complex surface (FIG. 2). This first support must be deformable and, if it is made of a metallic material, must be able to be annealed. It may thus be constituted by a copper foil having a thickness of the order of 10 to 40 microns.

In a second step (FIG. 3), there is then deposited on this first support 10 a layer of a first given material 11, for example a varnish, defining, in this first material, zones 12 corresponding to the shape of a giver circuit. In order to obtain these zones 12, it is possible to deposit the first material over the whole surface of the first support and then to define the zones therein, for example by photo-engraving or silk-screen process.

By way of example, the shape of the circuit illustrated is a cross, but it is obvious that it may be any other: circular, elliptic, square, etc . . .

When this second step is terminated, in a third step, a second material 13 is deposited in these zones in order to cover the whole bottom thereof, over a thickness smaller than that of the first material 11 (FIG. 4). By way of example, this second material may be gold, silver, nickel, aluminium or tin, which are good electrically conductive materials and among those which are most advantageously used for the application mentioned hereinbefore, and the thickness may be of some microns. Moreover, if the second material 13 is one of the three mentioned previously, it may advantageously be deposited by an electro-chemical process presenting the advantage, at the same time, of connecting the layer of this second material with the surface of the first support 10.

Having arrived at this stage, the process then consists, in a fourth phase, in eliminating the layer of the first material 11, without eliminating the second material 13 (FIG. 5). To that end, the two materials are chosen to be respectively attackable and non-attackable by a certain product. If the first material is a varnish and the second gold, the layer 11 may easily be eliminated by the action of a solvent not attacking the gold. This technique is, moreover, well known per se and will therefore not be described in greater detail.

At this stage, a still flat support 10 is therefore obtained which comprises, in relief on a face 15, all the patterns 16 having the shape of the zones which had been defined in the layer of the first material 11 originally deposited on this face 15.

In a fifth stage, the edges 17 of the first support 10 comprising the patterns 16 are gripped firmly in a frame 18 (FIG. 6) and the assembly of these two elements, support 10 and patterns 16, is applied on a second support 19, for example a substrate of composite material reinforced with glass fibers or aramide fibers such as those known under the trade name KEVLAR. This support 19 is such that its face 20 has the profile of the complex shape of the surface of the printed circuit having to be finally obtained. On the frame 18 are then applied efforts shown schematically by arrows 21, in order to deform the first support 10 and to give it the shape of this complex surface 20, by applying it against the face 20 of the second support 19.

The assembly of the two elements, first support and patterns, is, of course, connected by any means, for example glue previously spread over the face 20 of the second support 19.

In the example illustrated, the complex shape is a convex surface but it may be of any other shape.

When this fifth step is terminated, the material of the first support 10 is eliminated, so as to conserve on the second support of non-electrically conductive material, only the predetermined patterns 16 made of conductive material. If the first support is made of copper and the patterns of gold, the copper is eliminated by chemical attack with a solution of iron perchloride or an alkali solution. This operation may also be used with a first support made of aluminium.

FIGS. 8, 9 and 10, 11 show two modes of application of the first support 10 supporting the patterns 16 on the second support 19 made of non-conductive material.

Figure 8:
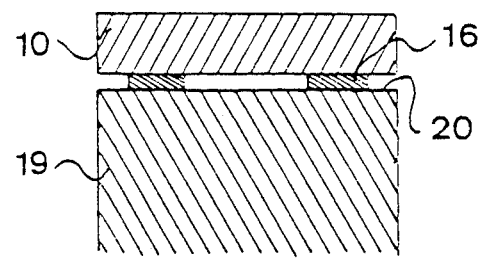
Figure 9:
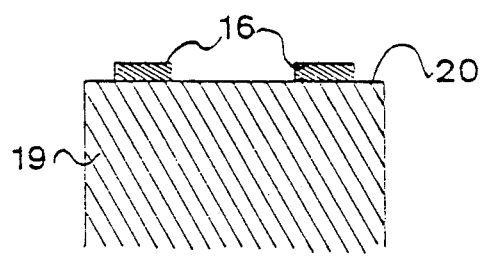

FIGS. 8 and 9 show a first mode of application. The assembly comprising the first support 10 with the patterns 16 is applied on the face 20 of the second support, so that the patterns 16 are in contact with this face, for example glued thereon (FIG. 8). In that case, the first support is attacked by the chemical product and, finally, there remain only patterns 16 on the face 20 of the second support (FIG. 9).

Figure 10:
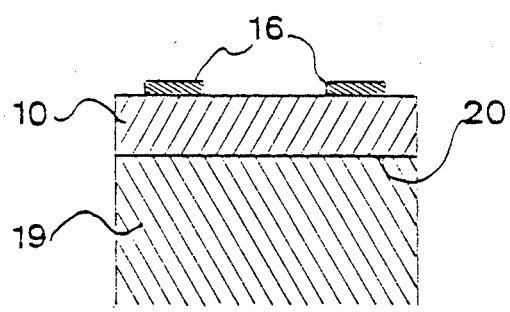
Figure 11:
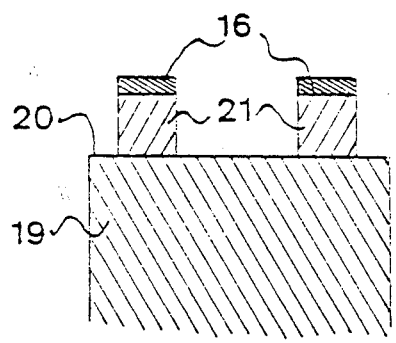

FIGS. 10 and 11 show another mode of application, in which the assembly of the support 10 and the patterns 16 is disposed on the second support 19 so that the first support 10 is itself directly glued on the face 20 of this second support. The material of the first support is then chemically attacked in the same manner as hereinabove. However, in this case, the patterns 16 remain located on columns 21 of material of the first support coming from parts of this first support which were not attacked chemically, since they were protected by the material of the patterns 16 which is itself non-attackable by the chemical product chosen for eliminating the material of the first support.

It should be specified that the Figures have been elaborated only to illustrate the different steps of carrying out the process and to enable it to be more readily understood, but that in no way do they intend to give a perfect representation, to scale, of the different thicknesses of the different layers of materials.

Figure 12:
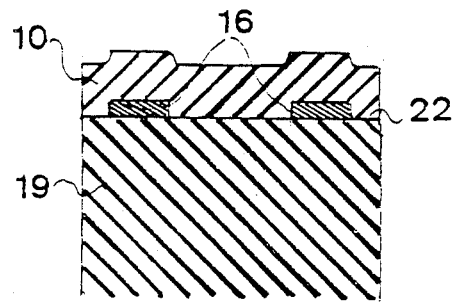
FIGS. 8 to 12 represent different embodiments which may be obtained with the process according to the invention.

In the embodiment given hereinabove, and up to the final result as illustrated in FIGS. 8 and 9, it is sometimes advantageous to choose the first support in a material of organic type, such as a thermoplastics resin. In that case, the assembly of the first support 10 and patterns 16 is advantageously disposed on the second support 19 in accordance with the mode of application illustrated in FIG. 8. In fact, the material constituting the first support not being electrically conductive, it is not necessary to eliminate it and if, in addition, the second support is chosen to be made of this same material (FIG. 12), adherence of the patterns may be obtained by simultaneous heating of the two supports until at least a partial fusion 22 is obtained therebetween, the patterns 16 then being imprisoned in this non-conductive material protecting them from any action of outside agents, which enables them to be made of any conductive material, even oxidizable.

The foregoing description shows all the advantages of the process according to the invention, in particular the fact that it makes it possible to solve the problems raised in modern technology for obtaining industrial production of printed circuits disposed on complex surfaces which are very difficult to develop, in particular for making reflectors of antennas of which one has been chosen, in the description, by way of example of application.

I claim:

1. Method for making an assembly of electrically conductive patterns on an electrically insulating non-developable surface, comprising the steps of:
   (a) forming said assembly of patterns on a face of a plastically deformable flat support;
   (b) applying said flat support, while being deformed, against said non-developable surface; and
   (c) connecting said deformed flat support to said non-developable surface.

2. Method as claimed in claim 1 wherein said deformable flat support is applied against said non-developable surface and connected therewith by its face bearing said patterns, and further comprising the step of:
   (d) totally eliminating said deformed flat support.

3. Method as claimed in claim 1 wherein said deformable flat support is applied against said non-developable surface and connected therewith by its face opposite the one bearing said patterns, and further comprising the step of:
   (d) eliminating said deformed flat support, except plumb with said patterns.

4. Method as claimed in claim 1 wherein step (a) comprises:
   depositing on said flat support a first layer in which is made an assembly of recesses in register with said assembly of patterns;
   depositing in said recesses a second electrically conductive layer; and
   eliminating said first layer.

5. Method as claimed in claim 4 wherein said recesses are defined by photo-engraving or serigraphy.

6. Method as claimed in claim 1 wherein step (c) is carried out by gluing.

7. Method as claimed in claim 1 wherein step (c) is carried out by fusion by heating.

8. Method as claimed in claim 3 wherein step (d) is carried out by chemical attack.

9. Method as claimed in claim 1 wherein said plastically deformable flat support is a foil having a thickness of between 10 and 40 microns.

10. Method as claimed in claim 1 wherein said plastically deformable flat support is a foil of annealed copper.

11. Method as claimed in claim 1 wherein said plastically deformable flat support is a foil of thermoplastics resin.

12. Method as claimed in claim 1 wherein deformable flat support is made of an electrically insulating material and is applied against said non-developable surface and connected therewith by its face opposite the one bearing said patterns, said support being maintained on said surface as protection of said patterns.

13. Method as claimed in claim 1 wherein said patterns are made of a metal which is gold, silver, nickel, aluminum or tin.

14. Method as claimed in claim 1 wherein said patterns are made by chemical or electro-chemical deposit.

* * * * *